United States Patent
Hara et al.

(10) Patent No.: US 8,106,433 B2
(45) Date of Patent: Jan. 31, 2012

(54) IMAGE PICKUP ELEMENT PERFORMING IMAGE DETECTION OF HIGH RESOLUTION AND HIGH IMAGE QUALITY AND IMAGE PICKUP APPARATUS INCLUDING THE SAME

(75) Inventors: Kunihiko Hara, Hyogo (JP); Hiroshi Kubo, Hyogo (JP); Yasuyuki Endo, Hyogo (JP); Masatoshi Kimura, Hyogo (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 12/967,604

(22) Filed: Dec. 14, 2010

(65) Prior Publication Data

US 2011/0079707 A1 Apr. 7, 2011

Related U.S. Application Data

(60) Division of application No. 12/382,159, filed on Mar. 10, 2009, now Pat. No. 7,868,365, which is a continuation of application No. 11/650,435, filed on Jan. 8, 2007, now Pat. No. 7,663,168, which is a continuation of application No. 11/081,950, filed on Mar. 17, 2005, now Pat. No. 7,193,258.

(30) Foreign Application Priority Data

Mar. 18, 2004 (JP) .................................. 2004078827

(51) Int. Cl.
    *H01L 31/062* (2006.01)
(52) U.S. Cl. .. 257/293; 257/292; 257/291; 257/E51.005
(58) Field of Classification Search .................. 257/291, 257/292, 293, 232, 233, 432, 49, 50, 51, 257/E51.055
See application file for complete search history.

(56) References Cited

U.S. PATENT DOCUMENTS

| | | | |
|---|---|---|---|
| 5,786,588 A | 7/1998 | Takahashi | |
| 6,188,094 B1 * | 2/2001 | Kochi et al. | 257/232 |
| 6,605,850 B1 * | 8/2003 | Kochi et al. | 257/431 |
| 6,657,665 B1 | 12/2003 | Guidash | |
| 6,784,928 B1 | 8/2004 | Sakurai et al. | |
| 7,193,258 B2 | 3/2007 | Hara et al. | |

FOREIGN PATENT DOCUMENTS

JP 362128677 6/1987
(Continued)

OTHER PUBLICATIONS

Hidekazu Takahashi et al. "A 3.9μm Pixel Pitch VGA Format 10b Digital Image Sensor With 1.5-Transistor/Pixel", ISSCC 2004/Session 6/Imaging/6.1, 2004 IEEE International Solid State Circuits Conference, pp. 108-109; 78.

(Continued)

*Primary Examiner* — Thinh T Nguyen
(74) *Attorney, Agent, or Firm* — Buchanan Ingersoll & Rooney PC

(57) ABSTRACT

In a pixel part, in a first active region, a photodiode and a transferring transistor are formed. In a second active region, a resetting transistor is formed. In a pixel part, in a first active region, a photodiode and a transferring transistor are formed. In a second active region, an amplifying transistor is formed. The first and second active regions are respectively the same in shape in image pixel parts. The resetting transistor and the amplifying transistor are shared by the pixel parts.

5 Claims, 8 Drawing Sheets

FOREIGN PATENT DOCUMENTS

| | | |
|---|---|---|
| JP | 2000-232216 | 8/2000 |
| JP | 2001-024948 | 1/2001 |
| JP | 2002-050752 | 2/2002 |
| JP | 2005-268537 | 9/2005 |

OTHER PUBLICATIONS

Mitsuyoshi Mori et al. "A ¼in 2M Pixel CMOS Image Sensor With 1.75Transistor/Pixel", ISSCC 2004/Session 6/Imaging/6.2, 2004 IEEE International Solid State Circuits Conference, pp. 110-111; 80.

Notice of Grounds of Rejection issued in corresponding Japanese Application No. JP 2004-078827 dated Sep. 1, 2009, and an English Translation thereof.

Notice of Grounds of Rejection issued in corresponding Japanese Application No. JP 2009-048210 dated Sep. 1, 2009, and an English Translation thereof.

Korean Office Action corresponding to Korean Application No. 10-2011-0073573, issued on Sep. 20, 2011.

* cited by examiner

IMAGE PICKUP ELEMENT PERFORMING IMAGE DETECTION OF HIGH RESOLUTION AND HIGH IMAGE QUALITY AND IMAGE PICKUP APPARATUS INCLUDING THE SAME

CROSS REFERENCE TO RELATED APPLICATION

This application is a divisional application of U.S. application Ser. No. 12/382,159, filed Mar. 10, 2009, which is a continuation application of U.S. application Ser. No. 11/650,435, filed Jan. 8, 2007, now U.S. Pat. No. 7,663,168, which is a continuation application of U.S. application Ser. No. 11/081,950, filed Mar. 17, 2005, now U.S. Pat. No. 7,193,258, which claims priority under 35 U.S.C. §119 to Japanese Patent Application No. 2004-078827 filed in Japan on Mar. 18, 2004, the entire content of which are hereby incorporated by reference in their entirety.

BACKGROUND OF THE INVENTION

1. Field of the Invention

The present invention relates to an image pickup element having a photoelectric conversion function and an image pickup apparatus including the same.

2. Description of the Background Art

Conventionally, image pickup elements having photoelectric conversion function are used as image sensors since they can be arranged one or two dimensionally to obtain image signals, and they find wide application such as video cameras, copy machines, facsimile machines and the like.

Among such image pickup elements, there are CMOS sensors manufactured through processes compatible with production of MOS (Metal Oxide Semiconductor) transistors of high integration density.

In recent years, particularly reduction of image pickup elements in size has been required, and various schemes for achieving a higher integration have been proposed.

In Japanese Patent Laying-Open Nos. 2001-24948 and 2002-50752, schemes for achieving a higher integration by reducing the number of components constituting one image pickup element corresponding to one pixel have been proposed. Specifically, the number of transistors per one pixel is reduced by arranging transistors and the like to be shared by a plurality of pixels.

The publications above disclose the schemes for improving the integration level by reducing the number of transistors per one pixel by arranging transistors to be shared by a plurality of pixels. However, since the number of components for each pixel is not uniform, layout patterns are not uniform among the pixels.

In this regard, there has been such a problem that so-called fixed pattern noises (hereinafter also referred to as FPN) occur greatly with nonuniform layout patterns, which prevent an image detection of high resolution and high image quality.

SUMMARY OF THE INVENTION

The present invention has been made to solve the problem described above, and an object thereof is to provide an image pickup element capable of performing an image detection of high resolution and high image quality and an image pickup apparatus including the same, by reducing transistors per one pixel and by suppressing fixed pattern noises.

An image pickup element according to the present invention includes: on a same substrate, first and second pixel parts each having first and second active regions used for forming constituting components, the first and second active regions being respectively the same in shape in the first and second pixel parts. The first pixel part includes a first photoelectric conversion element formed at the first active region, a first transferring transistor formed at the first active region for transmitting charges photoelectrically converted by the first photoelectric conversion element to a floating diffusion region, and a resetting transistor formed at the second active region for resetting the floating diffusion region. The second pixel part includes a second photoelectric conversion element formed at the first active region, a second transferring transistor formed at the first active region for transmitting charges photoelectrically converted by the second photoelectric conversion element to the floating diffusion region, and an amplifying transistor formed at the second active region for amplifying a signal corresponding to the charges in the floating diffusion region and outputting the amplified signal. The floating diffusion region is shared by the first and second pixel parts.

The image pickup element according to the present invention includes the first and second pixel parts each having the first and second active regions used for forming constituting components, and the first and second active regions are respectively the same in shape in the first and second pixel parts. Specifically, the active regions are the same among the pixel parts. Accordingly, the layout patterns can be uniform, and the so-called fixed pattern noises can be suppressed, whereby an image detection of high resolution and high image quality can be performed.

An image pickup apparatus according to the present invention includes: on a same substrate, a plurality of pixel parts arranged in rows and columns and each having first and second active regions used for forming constituting components, the first and second active regions being respectively the same in shape among the plurality of pixel parts; and a control part for controlling the plurality of pixel parts. The plurality of pixel parts are divided into sets by two pixel parts adjacent to each other in a first direction. One pixel part of each set includes a first photoelectric conversion element formed at the first active region, a first transferring transistor formed at the first active region for transmitting charges photoelectrically converted by the first photoelectric conversion element to a floating diffusion region, and a resetting transistor formed at the second active region for resetting the floating diffusion region. The other pixel part of each set includes a second photoelectric conversion element formed at the first active region, a second transferring transistor formed at the first active region for transmitting charges photoelectrically converted by the second photoelectric conversion element to the floating diffusion region, and an amplifying transistor formed at the second active region for amplifying a signal corresponding to the charges in the floating diffusion region and outputting the amplified signal. The floating diffusion region is shared by the one pixel part and the other pixel part of each set. The adjacent sets are arranged differently relative to each other in a second direction.

The image pickup apparatus according to the present invention includes a plurality of pixel parts arranged in rows and columns and each having the first and second active regions used for forming constituting components, and the first and second active regions are respectively the same in shape among the plurality of pixel parts. The plurality of pixel parts are divided into sets by two pixel parts adjacent to each other in a first direction. The adjacent sets are arranged differently relative to each other in a second direction. Accordingly, the adjacent sets are arranged in a zigzag, whereby difference in outputs due to difference in characteristics of the layout patterns can be suppressed, and eye discomfort of a user can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
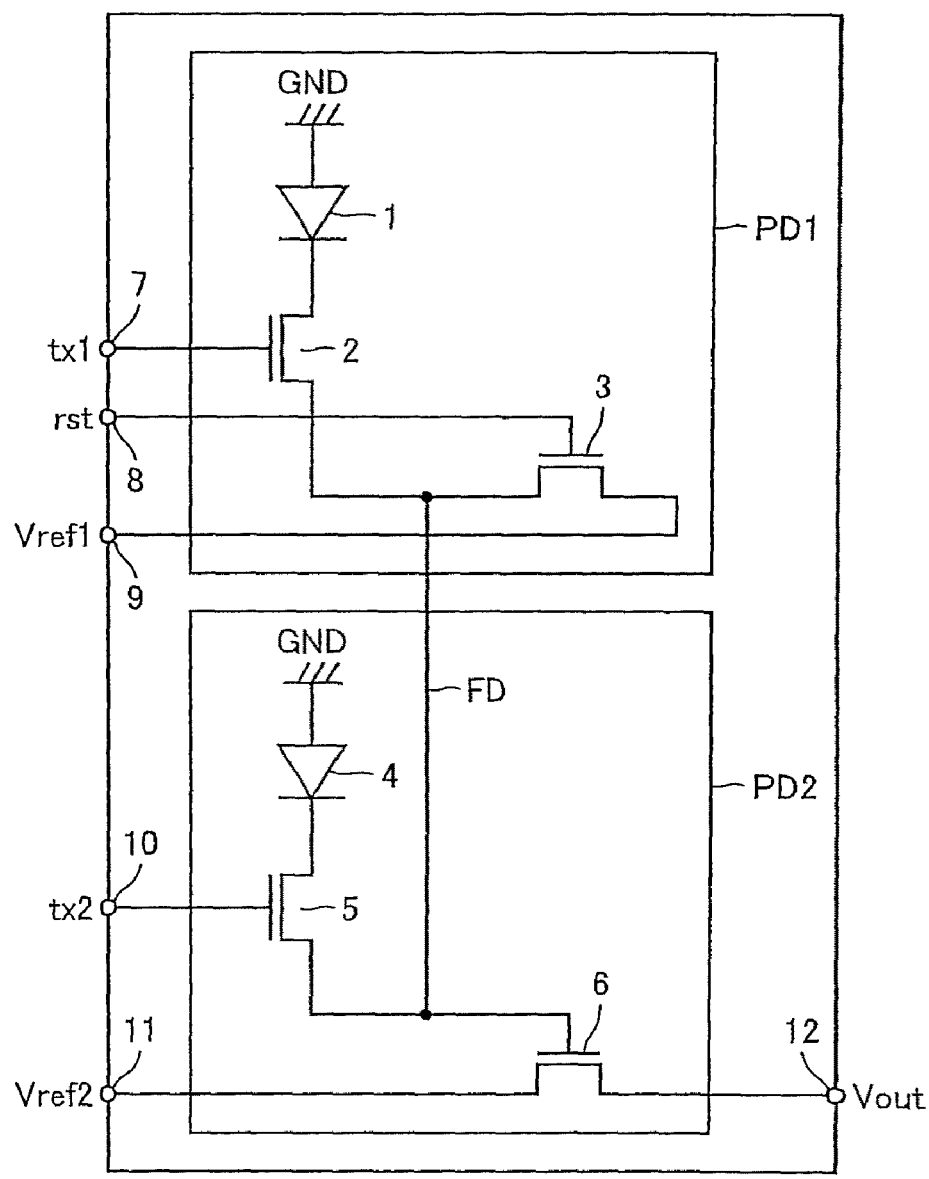
FIG. 1 is a conceptual illustration of an image pickup unit according to a first embodiment of the present invention.

In the following, embodiments of the present invention will be described in detail referring to the drawings. Throughout the drawings, the same or similar parts are denoted by the same reference character, and description thereof is not repeated.

First Embodiment

Referring to FIG. 1, an image pickup unit PDU according to a first embodiment is formed by two pixel parts PD1, PD2.

Pixel part PD1 includes a photodiode 1 having a photoelectric conversion function, a transferring transistor 2 transmitting photocarriers accumulated in photodiode 1 to a floating diffusion FD, and a resetting transistor 3 for resetting a potential of floating diffusion FD.

Pixel part PD2 includes a photodiode 4 having a photoelectric conversion function, a transferring transistor 5 transmitting photocarriers accumulated in photodiode 4 to floating diffusion FD, and an amplifying transistor for amplifying a signal transmitted to floating diffusion FD and outputting the amplified signal. Pixel parts PD1 and PD2 are electrically coupled to each other by floating diffusion FD.

Photodiode 1 and transferring transistor 2 are serially connected between fixed voltage GND and floating diffusion FD. Transferring transistor 2 has its gate electrically connected to a control terminal 7 to which a control signal TX1 is input.

Resetting transistor 3 is arranged between floating diffusion FD and a control terminal 9 to which a control voltage Vref1 is applied, and has its gate electrically connected to a control terminal 8 to which a control signal rst is input.

Photodiode 4 and transferring transistor 5 are serially connected between fixed voltage GND and floating diffusion FD. Transferring transistor 5 has its gate electrically connected to a control terminal 10 to which a control signal TX2 is input. Amplifying transistor 6 is arranged between a control terminal 11 to which a control voltage Vref2 is applied and an output terminal 12 outputting an amplified signal, and has its gate electrically connected to floating diffusion FD.

Accordingly, resetting transistor 3 and amplifying transistor 6 are constituents shared by pixel parts PD1 and PD2, and therefore the number of components can be reduced.

Figure 2:
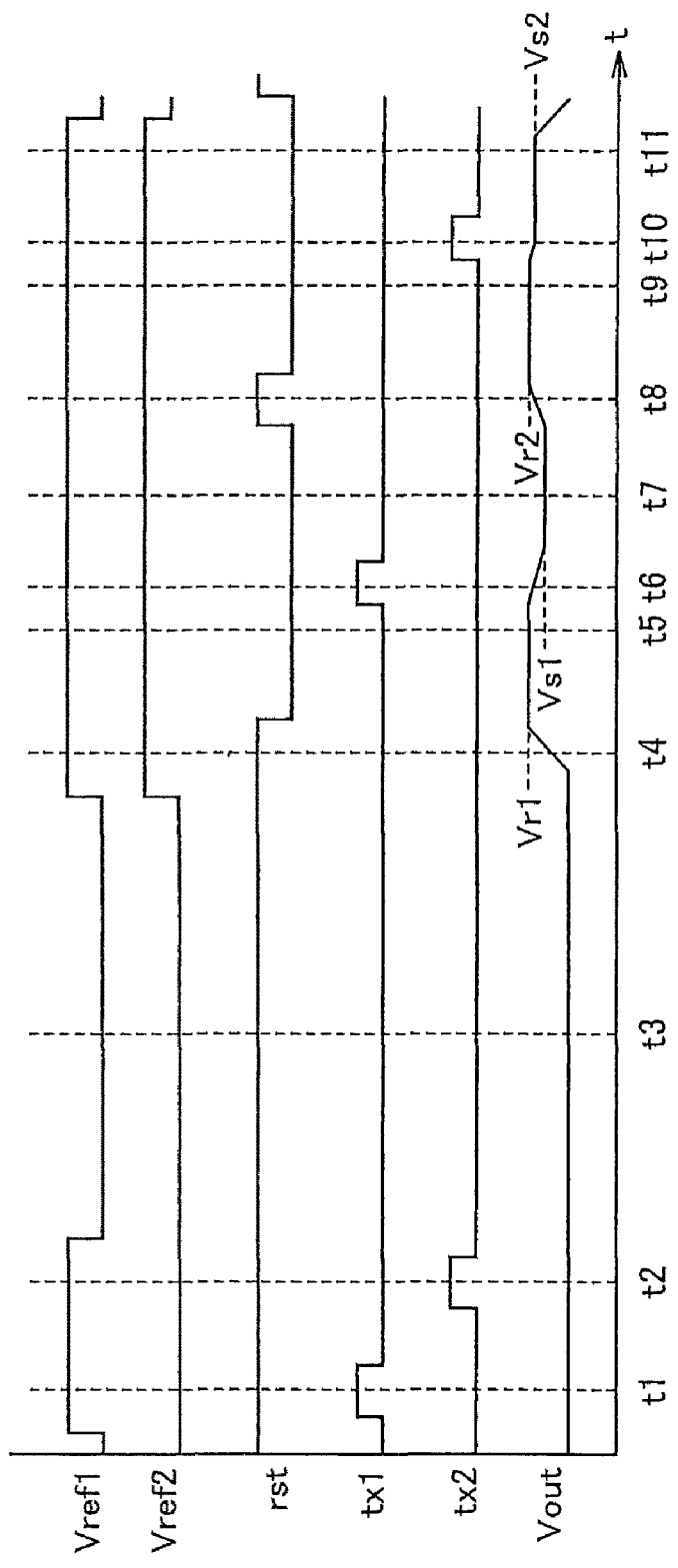
FIG. 2 is a timing chart related to a description of an operation of the image pickup unit according to the first embodiment of the present invention.

An operation of image pickup unit PDU according to the first embodiment of the present invention will be described referring to FIG. 2. In the following, binary high voltage state (for example, power source voltage VCC) and low voltage state (for example, fixed voltage GND) of signals, signal lines, data and the like are also referred to as "H" and "L" levels, respectively.

First, resetting of pixel parts PD1 and PD2 is described.

At time point t1, control signal tx1 is set at "H" level in a state where control voltage Vref1 is at "H" level and control signal rst is at "H" level. Thus, transferring transistor 2 and resetting transistor 3 turn on and the cathode side of photodiode 1 and control terminal 9 are electrically coupled, and resetting of photodiode 1 (PD reset) of pixel part PD1 is performed.

Similarly, PD reset of pixel part PD2 is performed at time point t2. Specifically, control signal tx2 is set at "H" level. Thus, transferring transistor 5 and resetting transistor 3 turn on and the cathode side of photodiode 4 and control terminal 9 are electrically coupled, and resetting of photodiode 4 of pixel part PD2 is performed.

At time point t3, since control signals tx1 and tx2 are both at "L" level, transferring transistors 2 and 5 are off. Accordingly, pixels are accumulated in two pixel parts PD1 and PD2.

Control voltage Vref1 is set at "L" level, and control signal rst is set at "H" level. Accordingly, the potential of floating diffusion FD is set at "L" level. Since control voltage Vref2, which is the drain potential of amplifying transistor 6, is also at "L" level, the output of image pickup unit PDU attains a high impedance state. As a result, a reading operation from another image pickup unit PDU is possible if, for example, a plurality of PDU are provided and a plurality of output terminals 12 are connected to one read line.

At time point t4, control voltage Vref1 is set at "H" level, and control signal rst is set at "H" level. Thus, floating diffusion FD is electrically coupled to control terminal 9. Thus, the potential of floating diffusion FD is set at "H" level, and the so-called FD reset is performed.

At time point t5, control signal rst is at "L" level, and control voltage Vref2, which is the drain potential of amplifying transistor 6, is set at "H" level. Accordingly, voltage Vr1 corresponding to the reset potential of floating diffusion FD is output from output terminal 12. Here, preparation of pixel part PD1 for a reading operation is completed.

Next, the reading operation of pixel part PD1 is described.

At time point t6, control signal tx1 is set at "H" level. Thus, transferring transistor 2 of pixel part PD1 turns on, and charges accumulated in the cathode of photodiode 1 are transferred to floating diffusion FD, whereby the potential of floating diffusion FD is decreased.

At time point t7, a voltage corresponding to floating diffusion FD having been changed from time point t6 is output to output terminal 12. In the present embodiment, the voltage is set at output voltage Vs1.

Thus, output voltage Vs1 is applied to a read line, which is not shown. By detecting output voltage Vr1-Vs1 in a circuit of a subsequent stage, which is not shown, a data signal proportional to charges accumulated in photodiode 1 of pixel part PD1 can be detected.

Next, a reading operation of pixel part PD2 is described.

Specifically, between time points t8 and t11, a signal proportional to charges accumulated in photodiode 4 of pixel part PD2 is detected. Specifically, at time point t8, control signal rst is set at "H" level. Thus, the so-called FD reset described above is performed, and the potential of floating diffusion FD is set at "H" level.

Next, at time point t9, voltage Vr2 corresponding to the reset potential of floating diffusion FD is output from output terminal 12. Thus, preparation of pixel part PD2 for the reading operation is completed.

At time point t10, control signal tx2 is set at "H" level. Thus, transferring transistor 5 of pixel part PD2 turns on, and charges accumulated in the cathode of photodiode 4 are transferred to floating diffusion FD, whereby the potential of floating diffusion FD is decreased.

At time point t11, a voltage corresponding to floating diffusion FD having been changed from time point t10 is output to output terminal 12. In the present embodiment, the voltage is set at output voltage Vs2 (>Vs1).

Thus, output voltage Vs2 is applied to a read line, which is not shown. By detecting output voltage Vr2-Vs2 (<Vr1-Vs1) in a circuit of a subsequent stage, which is not shown, a data signal proportional to charges accumulated in photodiode 4 of pixel part PD2 can be detected.

Figure 3:
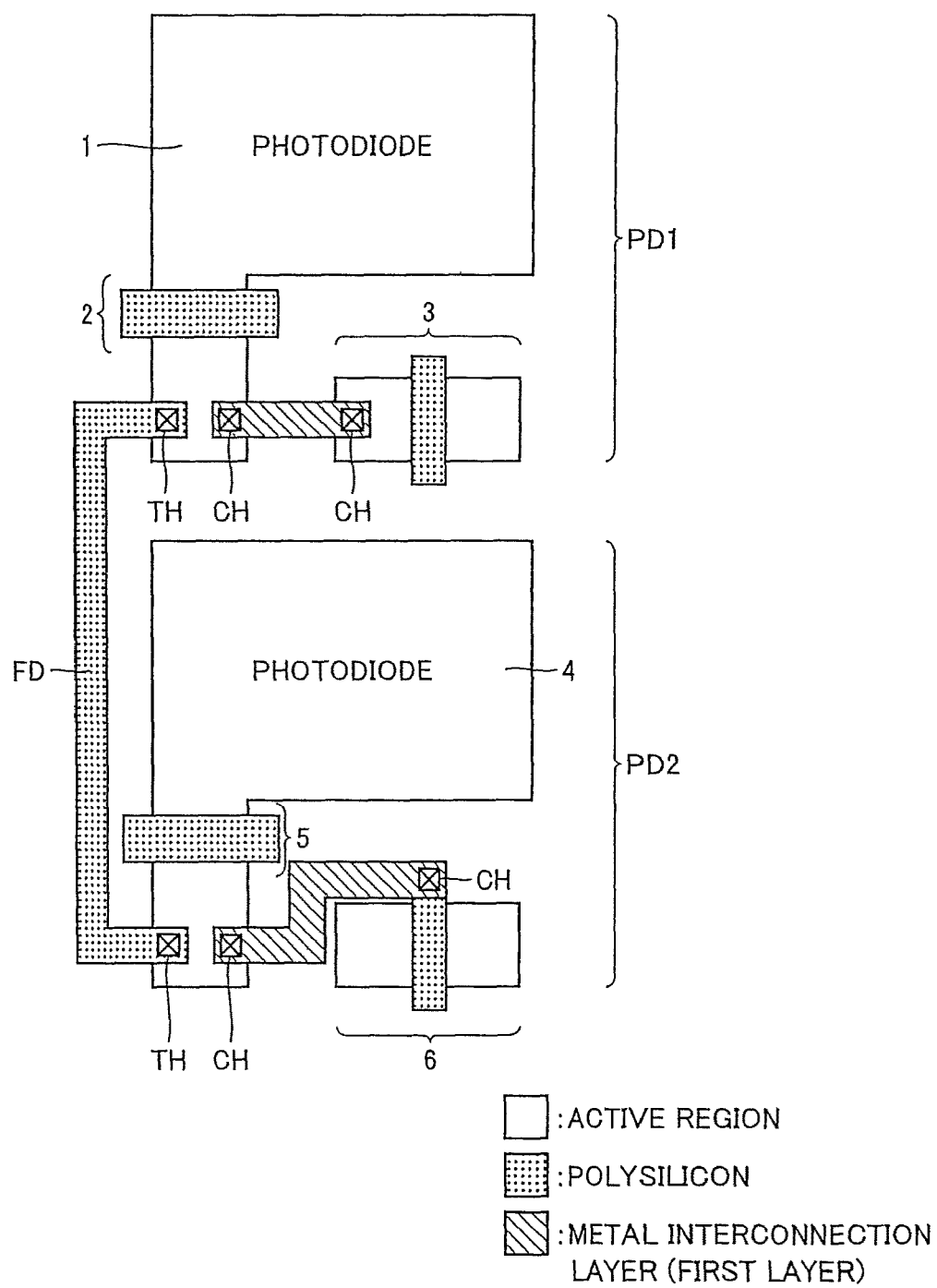
FIG. 3 shows a layout of the image pickup unit according to the first embodiment of the present invention.

Referring to FIG. 3, a scheme for unifying the layout patterns among pixel parts, i.e., for unifying configuration arrangement of components in each pixel part in image pickup unit PDU according to the first embodiment is described.

Referring to FIG. 3, in the present embodiment, on the same substrate, active regions, regions formed by polysilicon, interconnections formed by metal interconnection layers (first layers) are shown. Here, each of pixel parts PD1 and PD2 has a first active region where a photodiode and a transferring diode are formed and a second active region where another transistor is formed.

Specifically, in the first active region of pixel part PD1 of image pickup unit PDU according to the first embodiment of the present invention, photodiode 1 and transferring transistor 2 are formed. In the second active region, resetting transistor 3 is formed.

In the first active region of pixel part PD2, photodiode 4 and transferring transistor 5 are formed. In the second active region, amplifying transistor 6 is formed. In the first active region, the photodiode and the transferring transistor are formed at first and second regions, respectively. Here, with respect to two adjacent pixel parts PD1 and PD2, the second region of the first active region as well as the second active region are provided between first regions of two adjacent first active regions.

Floating diffusion FD electrically couples sources of transferring transistors of pixel parts PD1 and PD2 to each other by polysilicon via through holes TH. In other words, floating diffusion FD is shared by two adjacent pixel parts. In pixel part PD1, the first and second active regions are electrically coupled to each other using a metal interconnection layer (a first layer) via contact holes CH. In pixel part PD2, the poly-gate of polysilicon forming the gate electrode of amplifying transistor 6 is electrically coupled to floating diffusion FD via contact holes CH and a metal interconnection layer (a first layer).

As described above, the first and second active regions are respectively the same in shape in pixel parts PD1 and PD2. The poly-gates formed by polysilicon forming the gate electrodes of transferring transistors 2 and 5 are also the same in shape and arranged in the same direction. The poly-gate forming the gate electrode of resetting transistor 3 and the poly-gate forming the gate electrode of amplifying transistor 6 are also the same in shape and arranged in the same direction.

Accordingly, image pickup unit PDU according to the first embodiment of the present invention has a configuration in which two transistors are arranged per one pixel. In other words, it is a configuration in which the resetting transistor and the amplifying transistor are shared by two pixels, whereby the number of components is reduced and a higher integration can be achieved. Further, as described above, the first active regions are the same in shape and arranged in the same direction, and the poly-gates of transferring transistors are also the same in shape and arranged in the same direction in pixel parts PD. Accordingly, the layout patterns are the same, and therefore the photodiodes and transferring transistors are uniformly finished. Thus, fixed pattern noises (FPN) can be suppressed, and therefore an image detection of high resolution and high image quality can be performed.

The second active regions have been described in the foregoing to be the same between the pixel parts. On the other hand, as the second active regions are smaller as compared to the first active regions, their nonuniformity in layout patterns does not exert an influence as FPN. Accordingly, similar effect can be expected while the shapes are not fully identical, if, for example, basic shape and direction are the same. Thus, the gate widths/gate lengths of resetting transistor 3 of pixel part PD1 and amplifying transistor 6 of pixel part PD2 can be selected freely.

In the foregoing, while a configuration in which n type MOS transistors are used has mainly been described, p type MOS transistors can also be used. Specifically, it can be implemented by providing transferring registers of p type MOS transistors on the anode side of the photodiodes.

Figure 4:
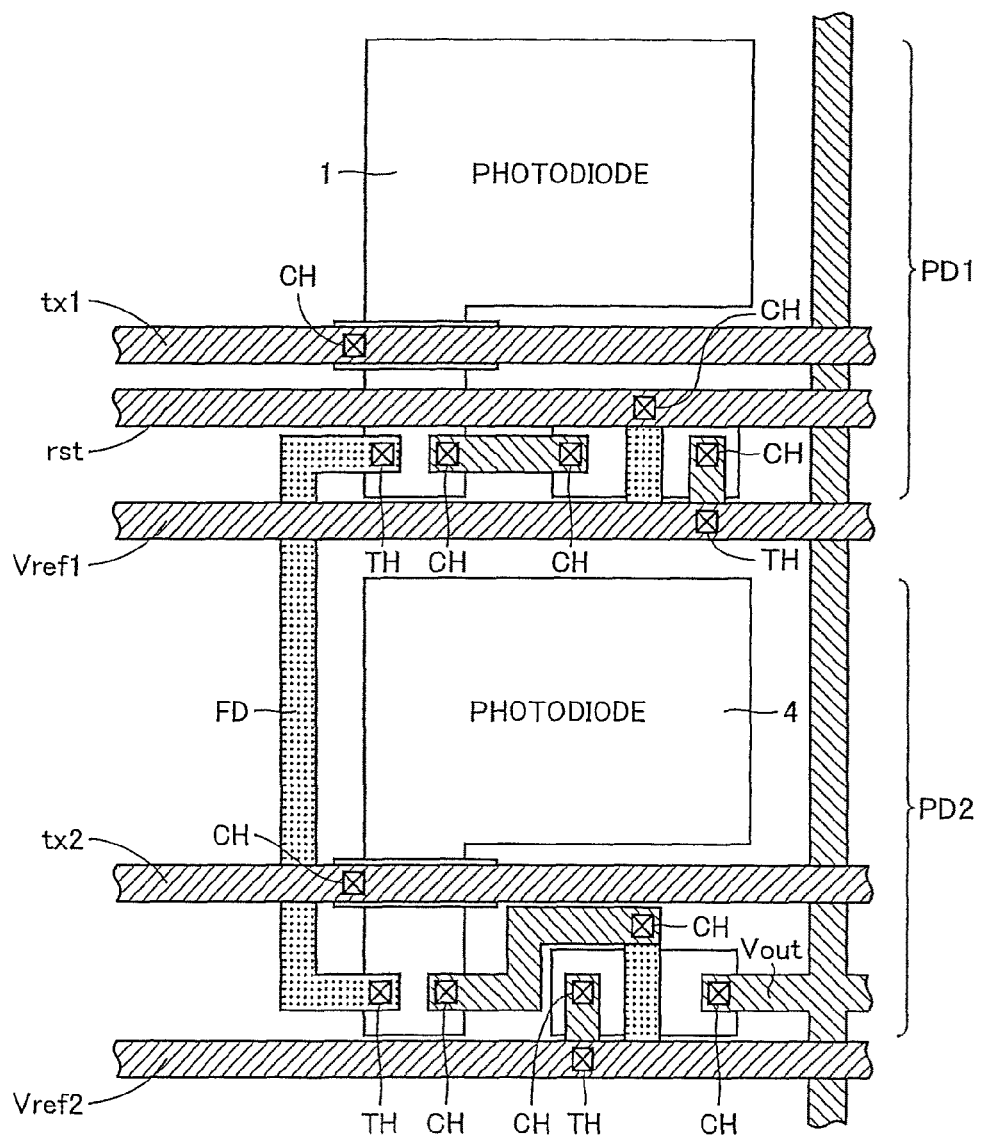
FIG. 4 is a conceptual illustration in which interconnections for supplying control signals and control voltages and the like are laid out in the layout of FIG. 3.

Referring to FIG. 4, a case is described where interconnections for supplying control signals and control voltages and the like are laid out according to the layout described referring to FIG. 3.

In FIG. 4, interconnections supplying control signals tx1, tx2 and rst, and control voltages Vref1 and Vref2 are shown. Specifically, signal lines transmitting control signals tx1 and tx2 are electrically coupled to the poly-gates of transferring transistors 2 and 5 via contact holes CH, respectively. Signal line transmitting control signal rst is electrically coupled to the poly-gate of resetting transistor 3 via contact hole CH. An interconnection supplying control voltage Vref1 (a metal interconnection layer (a second layer)) is electrically coupled to a metal interconnection layer (a first layer) via through hole TH, and the metal interconnection layer (the first layer) is further electrically coupled to the source side of resetting transistor 3 via contact hole CH.

An interconnection supplying control voltage Vref2 (a metal interconnection layer (a second layer)) is electrically coupled to a metal interconnection layer (a first layer) via through hole TH, and the metal interconnection layer (the first layer) is further electrically coupled to the drain side of amplifying transistor 6 via contact hole CH. Each of these metal interconnection layers (the second layers) is arranged along a horizontal direction, and on the second region of the first active region as well as on the second active region. Thus, the aperture ratio of the photodiodes can fully be ensured. The source side of amplifying transistor 6 is electrically coupled through contact hole CH to a read line to which output voltage Vout is transmitted. The read line is arranged along a vertical direction and perpendicular to the interconnections (the second layers) supplying the control signals and control voltages, and formed using a metal interconnection layer (a first layer).

Second Embodiment

Figure 5:
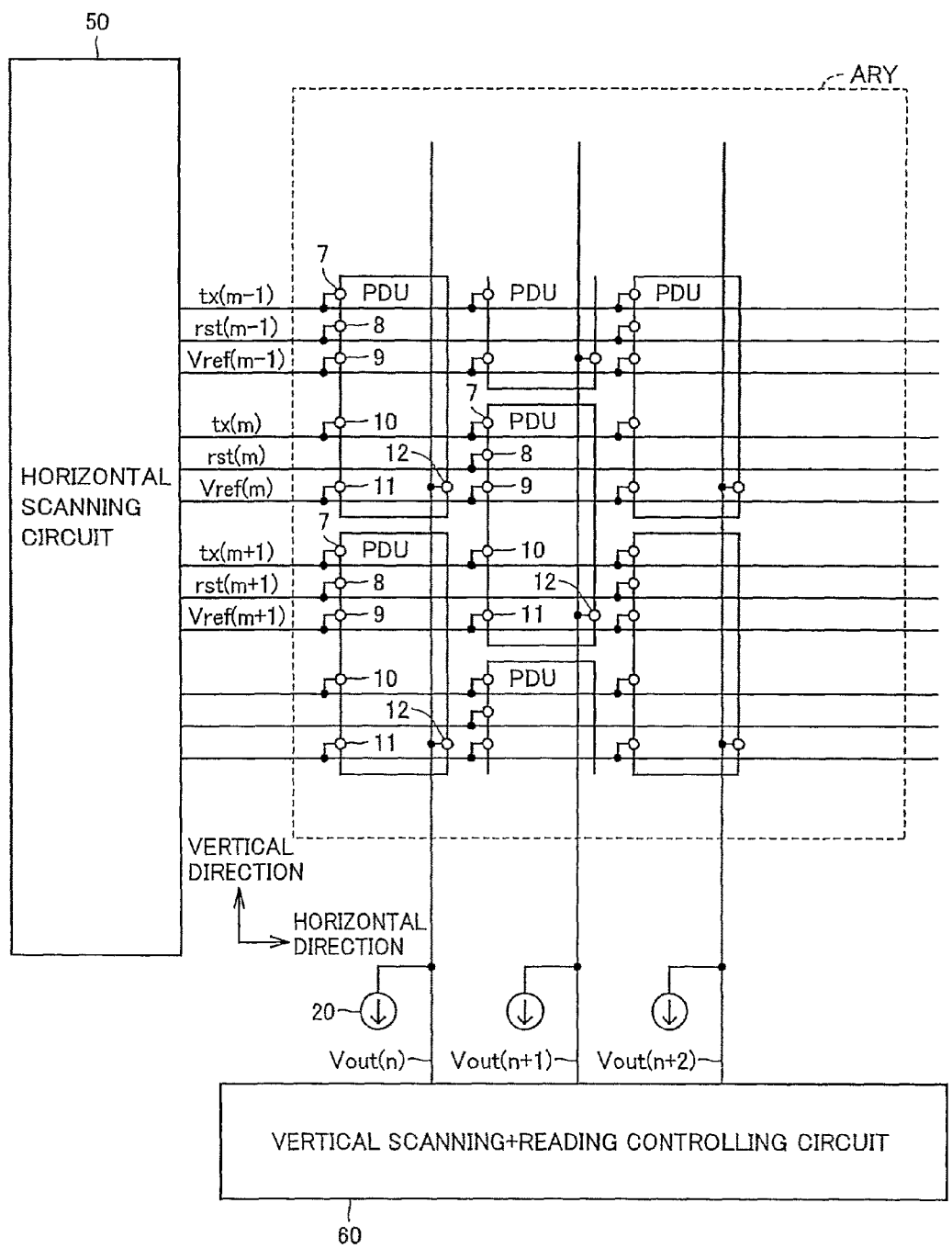
FIG. 5 is a conceptual illustration of image pickup units arranged on an array according to a second embodiment of the present invention.

Referring to FIG. 5, image pickup unit PDU arranged on an array ARY according to a second embodiment of the present invention is described.

FIG. 5 shows array ARY having a plurality of pixel parts PD arranged in rows and columns, a horizontal scanning circuit 50 for outputting control signals tx and rst and control voltage Vref and the like to control image pickup unit PDU, a vertical scanning+reading controlling circuit 60 for selecting an output signal via read lines from image pickup unit PDU and for reading a data signal, and constant current sources 20 for controlling voltage levels of read lines in data reading.

In array ARY, a plurality of pixel parts PD are arranged as image pickup units PDU, each being a set of two adjacent pixel parts PD arranged in a first direction that is the vertical direction. Pixel parts PD in each image pickup unit PDU are the same as that described in the first embodiment, and therefore detailed description thereof is not repeated.

In the horizontal direction, adjacent image pickup units PDU are arranged differently in relation to each other. In other words, image pickup units PDU are arranged in a zigzag. With such pixel layout, difference in outputs due to difference in characteristics of the layout patterns of adjacent image pickup units PDU can be suppressed. In other words, since there is less difference in outputs with respect to incident light of the same intensity, eye discomfort of a user can be reduced.

In the present embodiment, signal lines supplying control signals tx (m−1)-tx (m+1) and rst (m−1)-rst (m+1) and control voltages Vref (m−1)-(m+1) of (m−1)-(m+1)th row (m: a natural number of at least two) and read lines transmitting output voltages Vout (n)-Vout (n+2) are shown exemplarily.

In the present embodiment, pixel part at xth row and yth column is expressed as P (x, y). Here, pixel parts P (m−1, n), P (m, n), P (m+1, n), P (m, n+1), and P (m+1, n+1) are mainly described. Pixel parts P (m−1, n) and P (m, n) constitute one image pickup unit PDU. Pixel parts P (m, n+1), and P (m+1, n+1) constitute one image pickup unit PDU.

Specifically, pixel part P (m−1, n) receives control signals tx (m−1) and rst (m−1) and control voltage Vref (m−1) at control terminals 7-9, respectively. Pixel part P (m, n) receives control signal tx (m) and control voltage Vref (m) at control terminals 10 and 11, respectively, and outputs output voltage Vout (n) to a read line from output terminal 12. Pixel part P (m+1, n) receives control signals tx (m+1) and rst (m+1) and control voltage Vref (m+1) at control terminals 7-9, respectively. Pixel part P (m, n+1) receives control signals tx (m) and rst (m) and control voltage Vref (m) at control terminals 7-9, respectively. Pixel part P (m+1, n+1) receives control signal tx (m+1) and control voltage Vref (m+1) at control terminals 10 and 11, respectively, and outputs output voltage Vout (n+1) to a read line from output terminal 12. Other pixel parts configured on array ARY are also supplied with control signals tx and rst and control voltage Vref, according to the similar scheme.

Figure 6:
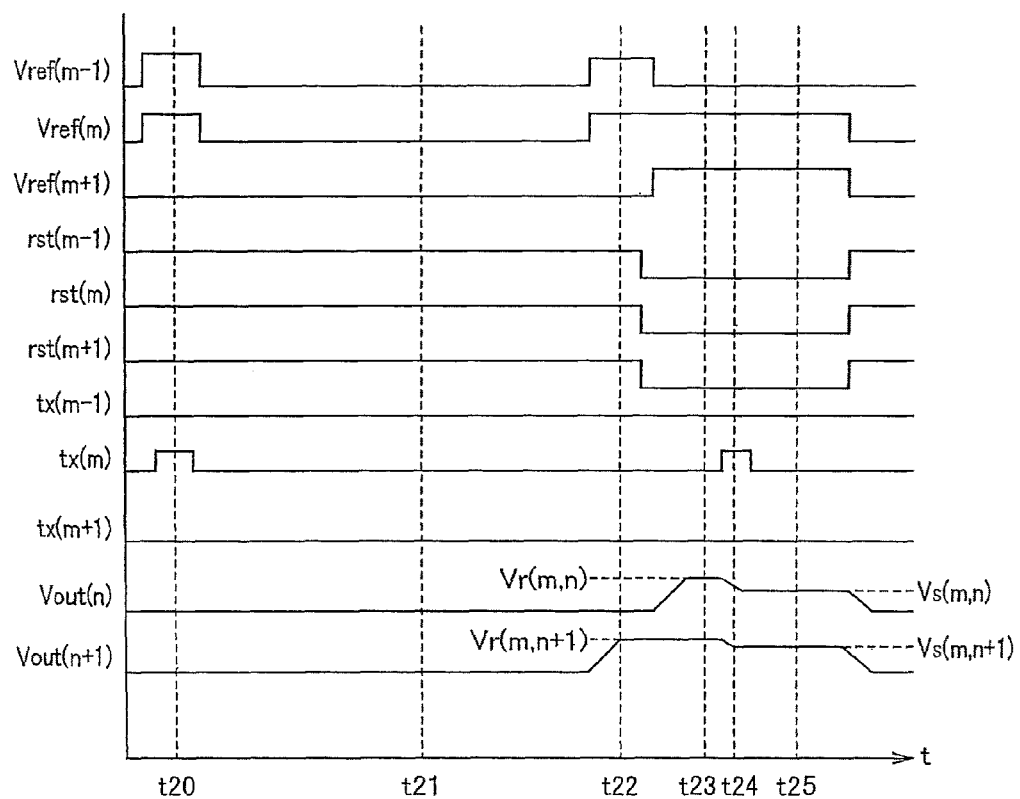
FIG. 6 is a timing chart related to a description of a series of reading operations of pixel parts arranged on the array of FIG. 5.

Referring to FIG. 6, a series of reading operations of pixel parts P(m, n) and P (m, n+1) arranged on array ARY in FIG. 5 is described.

At time point t20, by setting control voltage Vref (m−1) at "H" level, control signal rst (m−1) at "H" level, and control signal tx (m) at "H" level, as described above, PD reset of pixel part P(m, n) is performed. By setting control voltage Vref (m) at "H" level, control signal rst (m) at "H" level, and control signal tx (m) at "H" level, as described above, PD reset of pixel part P(m, n+1) is performed.

At time point t21, since the transferring transistors are off, pixels are accumulated in pixel parts P (m, n) and P(m, n+1).

At time point t22, control voltage Vref (m−1) is set at "H" level and control signal rst (m−1) is set at "H" level. Thus, FD reset of pixel part P(m, n) is performed. Similarly, control voltage Vref (m) is set at "H" level, and control signal rst (m) is set at "H" level. Thus, FD reset of pixel part P (m, n+1) is performed.

At time point t23, control signal rst (m) is set at "L" level and Vref(m+1) is set at "H" level. Thus, the drain potential of the amplifying transistor (arranged at pixel part P (m+1, n+1)) for outputting a signal of pixel part P(m, n+1) is set at "H" level. Accordingly, output voltage Vout (n+1) is output to a read line as output voltage (m, n+1) corresponding to the reset potential of floating diffusion FD from output terminal 12. Similarly, control signal rst (m−1) is set at "L" level and Vref (r) is set at "H" level. Thus, the drain potential of the amplifying transistor of pixel part P (m, n) is set at "H" level. Accordingly, output voltage Vout (n) is output to a read line as output voltage Vr (m, n) corresponding to the reset potential of floating diffusion FD from output terminal 12. Here, preparation of pixel parts P (m, n) and P (m, n+1) for a reading operation is completed.

At time point t24, control signal tx (m) is set at "H" level. Thus, the transferring transistors of pixel parts P (m, n) and P (m, n+1) turn on, and charges accumulated in the cathode of the photodiodes are transferred to floating diffusion FD. Thus, the potential of floating diffusion FD is decreased.

At time point t25, voltages corresponding to floating diffusion FD after transferring the charges are output as output voltages Vout (n) and Vout (n+1).

In the present embodiment, the output voltages from pixel parts P(m, n) and P (m, n+1) are expressed as Vs (m, n) and Vs (m, n+1) (>Vs (m, n)), respectively.

By detecting Vr (m, n)-Vs (m, n) in the circuit of subsequent stage, a data signal proportional to charges accumulated in the photodiode of pixel part P (m, n) can be detected. Similarly, by detecting Vr (m, n+1)-Vs (m, n+1), a data signal proportional to charges accumulated in the photodiode of pixel part P (m, n+1) can be detected. It is noted that a pixel accumulation period in which photocarriers are accumulated is a period between time points t20-t24 in pixel parts P (m, n) and P (m, n+1). By shifting the above-described operation per row at constant intervals so that it can be applied to all of the rows, detection of data signals that are pixel information can be performed.

Modification of Second Embodiment

Figure 7:
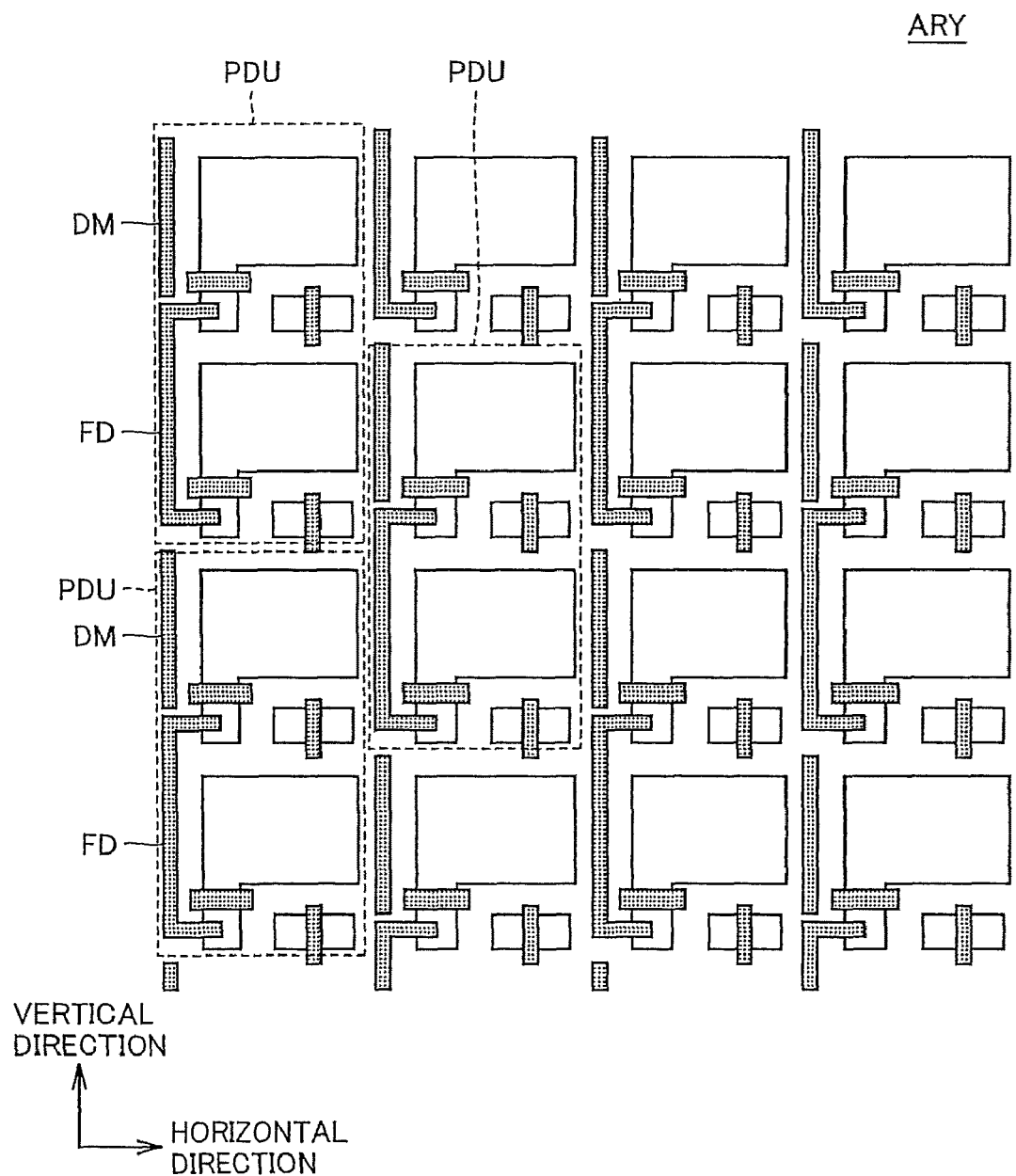
FIG. 7 is a conceptual illustration related to a description of layout patterns of image pickup units on an array according to a modification of the second embodiment of the present invention.

Referring to FIG. 7, layout patterns of image pickup units PDU on array ARY according to a modification of the second embodiment of the present invention is described.

Referring to FIG. 7, in the present modification, only the active regions and the regions formed by polysilicon constituting image pickup units PDU are shown.

Image pickup unit PDU according to the modification of the second embodiment of the present invention is different from the layout pattern of image pickup unit PDU according to the first embodiment described referring to FIG. 3 in that a dummy polysilicon region DM is formed, in addition to the polysilicon region electrically connecting two pixel parts PD, which is floating diffusion FD. Specifically, in image pickup unit PDU, along the vertical direction, similarly to the polysilicon used for electrical interconnection provided as part of floating diffusion FD, dummy polysilicon region DM is formed. The polysilicon as floating diffusion FD and dummy polysilicon region DM are electrically disconnected from each other.

Accordingly, with dummy polysilicon region DM, the layout patterns of pixel parts in image pickup unit PDU are substantially unified further. Thus, the fixed pattern noises (FPN) can further be suppressed, and therefore an image detection of high image quality can be performed.

Figure 8:
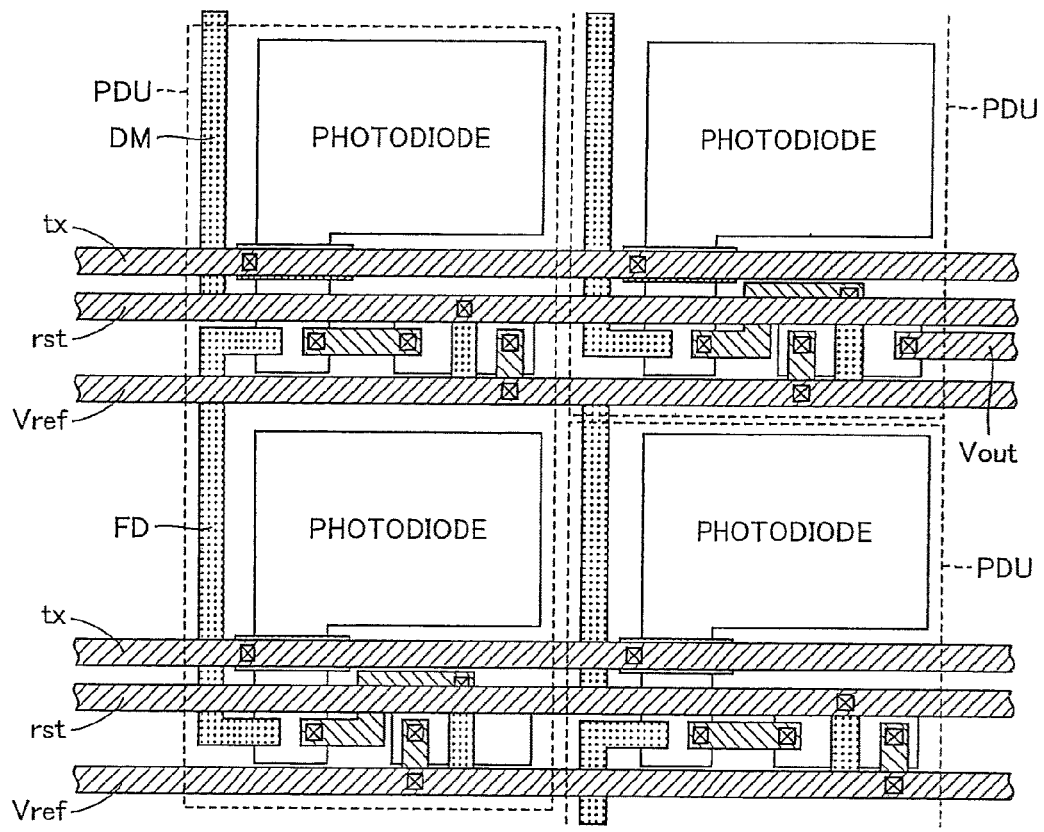
FIG. 8 is a schematic diagram in which metal interconnections are arranged for transmitting control signals and the like in the row direction in the layout configuration of FIG. 5 that is described in the second embodiment.

Referring to FIG. 8, a case is described where metal interconnections transmitting control signals and the like in the row direction are arranged in the layout configuration of FIG. 5 described in the aforementioned second embodiment.

As to the connection relationship of the metal interconnections shown in FIG. 8, since they are connected in accordance with the scheme similar to the connection scheme of the metal interconnections described with reference to FIG. 4, detailed description thereof is not repeated.

In the present embodiment, as described above referring to FIG. 4, signal lines in metal interconnection layers (the second layers) are arranged along the horizontal direction, and on the second region of the first active region, where the transferring transistor is formed, and on the second active region, where at least one of the reset transistor and the amplifying transistor is formed, in each pixel part PD. It is noted that, as described above, in each image pickup unit PDU, the second region of the first active region as well as the second active region are provided between first regions of two adjacent first active regions along the vertical direction.

Accordingly, since metal interconnection layers (the second layers) are not arranged in the first regions of the first active regions where photodiodes are formed, in array ARY, the aperture ratio of the photodiodes can fully be ensured.

Figure 9:
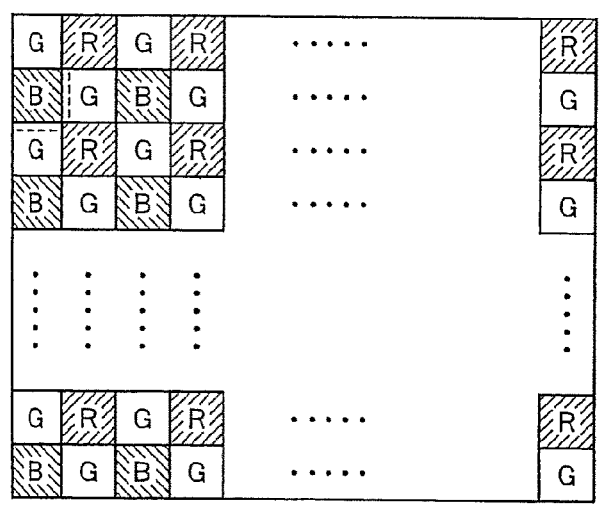
FIG. 9 shows a pattern where color films are arranged overlapping respective pixels.

Referring to FIG. 9, a pattern where color films are arranged overlapping respective pixels is described.

Generally, as the color films, three colors of green (G), red (R) and blue (B) are used. Here, green (G) is arranged according to a certain pattern rule. Specifically, it is arranged in a diagonal direction. Thus, in the pixel parts, the fixed pattern noises due to difference in characteristics of two green (G) when overlapping color films can be suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An image sensor comprising:
a first image pickup element, and
a second image pickup element, wherein
each of said first and second image pickup elements comprises
a first photoelectric conversion element,
a second photoelectric conversion element,
a first transferring transistor, one terminal of which is connected to said first photoelectric conversion element,
a second transferring transistor, one terminal of which is connected to said second photoelectric conversion element,
a reset transistor, one terminal of which is connected to another terminal of said first transferring transistor and another terminal of said second transferring transistor, and
an amplifying transistor, a control terminal of which is connected to said another terminal of said first transferring transistor and said another terminal of said second transferring transistor, wherein
said first photoelectric conversion elements of said first and second image pickup elements are arranged along a first direction, wherein
each of said second photoelectric conversion elements is arranged along a second direction relative to each of said first photoelectric conversion elements in the same image pickup element, and wherein
a first portion of an interconnection layer between said another terminal of said first transferring transistor and said control terminal of said amplifying transistor is arranged along said second direction to a first side of said second photoelectric conversion element in said first image pickup element, a second portion being the same material as said first portion is arranged along said second direction to a first side of said first photoelectric conversion element in said first image pickup element.

2. The image sensor according to claim 1, wherein said first portion is formed by polysilicon.

3. The image sensor according to claim 1, wherein a length of each of said first and second photoelectric conversion elements in said second direction is shorter than that of each of said first and second photoelectric conversion elements in said first direction.

4. The image sensor according to claim 1, wherein a length of each of said reset transistors in said second direction is shorter than that of each of said reset transistors in said first direction, and wherein a length of each of said amplifying transistors in said second direction is shorter than that of each of said amplifying transistors in said first direction.

5. The image sensor according to claim 4, wherein a length of each control gate of said reset transistors in said second direction is longer than that of each control gate of said reset transistors in said first direction, and wherein a length of each control gate of said amplifying transistors in said second direction is longer than that of each control gate of said amplifying transistors in said first direction.

* * * * *